US008610479B2

(12) United States Patent
Lee et al.

(10) Patent No.: US 8,610,479 B2
(45) Date of Patent: Dec. 17, 2013

(54) ON DIE LOW POWER HIGH ACCURACY REFERENCE CLOCK GENERATION

(75) Inventors: Kochung Lee, San Jose, CA (US); Quan Yu, Shanghai (CN); Yuntao Zhu, Shanghai (CN); Lei Xie, Shanghai (CN); Ming Qu, San Jose, CA (US)

(73) Assignee: Parade Technologies, Ltd., Georgetown, Grand Cayman (KY)

( * ) Notice: Subject to any disclaimer, the term of this patent is extended or adjusted under 35 U.S.C. 154(b) by 0 days.

(21) Appl. No.: 13/276,269

(22) Filed: Oct. 18, 2011

(65) Prior Publication Data
US 2013/0093466 A1    Apr. 18, 2013

(51) Int. Cl.
*G06F 1/04*    (2006.01)
(52) U.S. Cl.
USPC .............. 327/291; 327/299; 327/39; 327/113
(58) Field of Classification Search
USPC ........................ 327/291, 299, 39–49, 113–123
See application file for complete search history.

(56) References Cited

U.S. PATENT DOCUMENTS

| 5,543,754 | A * | 8/1996 | Onodera .......................... 331/25 |
| 5,848,265 | A * | 12/1998 | Maas et al. ..................... 713/500 |
| 7,750,618 | B1 * | 7/2010 | Fang et al. ................. 324/76.41 |
| 7,755,409 | B2 * | 7/2010 | Takeuchi ........................ 327/291 |
| 7,924,964 | B2 * | 4/2011 | Tseng et al. ..................... 375/373 |
| 2008/0100391 | A1 * | 5/2008 | Lim et al. ...................... 331/143 |
| 2008/0174361 | A1 * | 7/2008 | Gomez .......................... 327/536 |
| 2011/0319036 | A1 * | 12/2011 | Tse-Peng ........................ 455/76 |
| 2012/0242395 | A1 * | 9/2012 | Ding ............................. 327/427 |

\* cited by examiner

*Primary Examiner* — Nguyen Tran
*Assistant Examiner* — Afework Demisse
(74) *Attorney, Agent, or Firm* — Fenwick & West LLP

(57) ABSTRACT

A system and method are disclosed for generating a high accuracy and low power on die reference clock. An LC clock is generated on die and a frequency divider lowers the LC clock frequency to a target reference frequency. An RCO clock is generated on die with an unknown initial frequency. The RCO clock and target reference clock are compared to determine in which direction the frequency of the RCO clock should be adjusted to move closer to the target reference frequency. A signal is sent causing a current source or capacitor in the RCO circuit to be modified. Therefore, the RCO clock frequency is adjusted. The RCO circuit is repeatedly adjusted until the RCO clock frequency is sufficiently accurate. The LC clock is disabled to conserve the power that would have been consumed in generating the LC clock.

21 Claims, 5 Drawing Sheets

ON DIE LOW POWER HIGH ACCURACY REFERENCE CLOCK GENERATION

BACKGROUND

1. Field of Art

The disclosure generally relates to clock generation. More specifically, the disclosure relates to generating a low power high accuracy on die reference clock.

2. Description of the Related Art

During operation, many systems with an integrated circuit utilize an external reference clock generated by a crystal and corresponding clock generator. An external clock adds undesirable cost and size to the system. An on chip solution, while reducing footprint, should consume little power and be unlikely to produce an inaccurate clock frequencies due to changes in process, voltage, or temperature. One on chip solution is to utilize an LC circuit as an on chip reference clock. However, this results in high power drain when the LC circuit is powered. Microelectromechanical systems (MEMS) resonators may also be used to integrate a reference clock on chip. However, a MEMS resonator design has drawbacks as well including sensitivity to changes in temperature and a special, non-standard, foundry process which significantly increases manufacturing costs. MEMS resonators also suffer from high power draw similar to LC circuits. Designers of modern systems desire a low cost and low power reference clock that does not impede slim and non-intrusive system design.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

Figure 1:
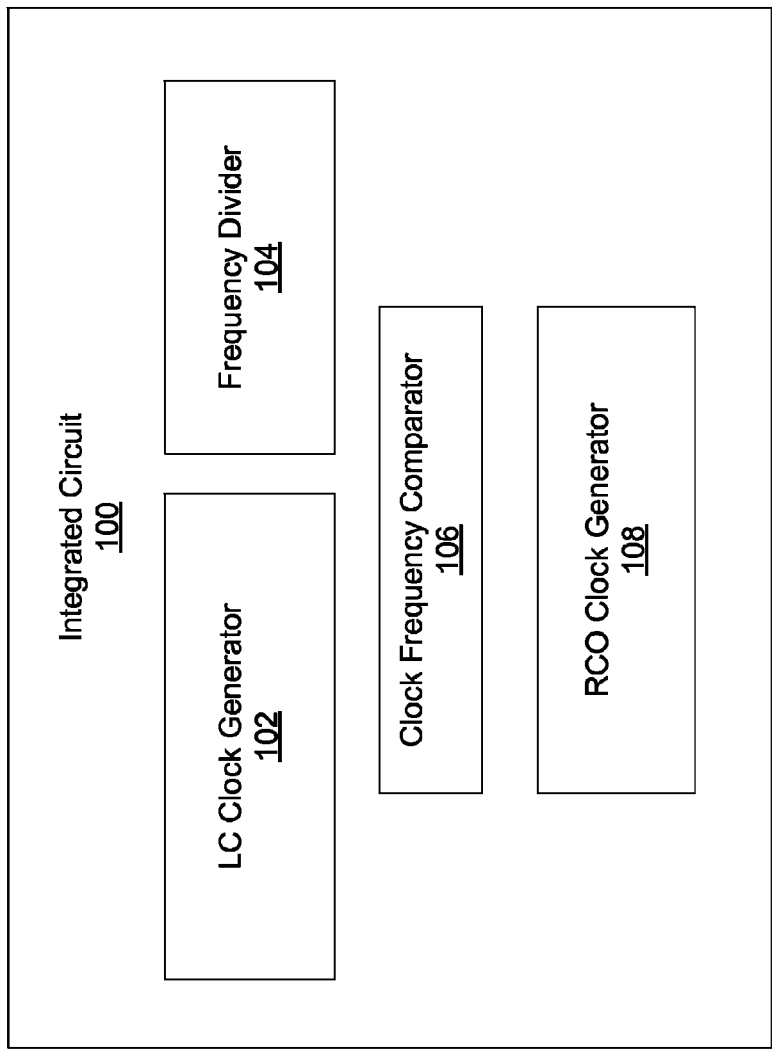
FIG. 1 illustrates an integrated circuit with an on chip generated reference clock.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Configuration Overview

Various embodiments provide a system and method for generating a low power and high accuracy on die reference clock. The disclosed system and method can decrease the power consumption and space used in generating a reference clock while maintaining clock accuracy. In an example embodiment, reference clock generation functionality is embedded into an integrated circuit. An on die LC circuit is used to generate an LC reference clock at a preliminary frequency. Existing metal layers of a chip are utilized as the inductive portion of the LC circuit. One or more Metal-Oxide-Silicon (MOS) capacitors serve as the capacitive portion of the LC circuit. In one embodiment, multiple banks of MOS capacitors may be used to achieve varied capacitance and tune the LC circuit to the preliminary frequency. The LC generated reference clock is accurate due to both the MOS capacitors and the metal layers of the chip, the components of the LC circuit, being insensitive to changes in process, voltage and temperature. A frequency divider can be used to reduce the preliminary clock frequency to a target clock frequency. The generated LC reference clock is then lowered to a target reference clock frequency by a frequency divider. Hence, the on chip LC circuit provides a stable and accurate on die high speed reference clock at a target frequency, but the LC circuit suffers from high power consumption during operation.

The LC generated reference clock is subsequently used to train an RC oscillator (RCO) which consumes significantly less power. The RCO is sensitive to process variation and cannot be relied upon for accurate clock generation unless trained by the LC generated reference clock. The RCO circuit is powered and its output, an RCO reference clock, begins at some unknown frequency. A comparator receives the divided LC clock and RCO clock as input and calculates if the RC clock is higher or lower. The RCO is then tuned to match the divided LC clock and accurately outputs at the target reference clock frequency after several iterations. The RCO can be tuned through either adjusting a current source supplying current to the RCO circuit, or by adjusting the capacitance of the RCO circuit. After being tuned to account for process variation, an RCO generated reference clock is typically stable over changes in voltage and temperature and can be relied upon for accurate reference clock generation.

Referring now to FIG. 1, illustrated is an integrated circuit 100 with an on chip generated reference clock. The integrated circuit 100 includes an LC clock generator 102, frequency divider 104, clock frequency comparator 106 and RCO clock generator 108. The LC clock generator generates an LC reference clock through powering an LC circuit. In one embodiment, the LC circuit is made up of metal layers of the integrated circuit and MOS capacitors with a preset capacitance, both of which are insensitive to changes in process, voltage or temperature. Multiple banks of capacitors may be used to achieve different capacitance of the LC circuit in various configurations. In one embodiment, the MOS capacitors are biased to either the cut of region or saturation region to leave little variance in the resulting capacitance. With the LC circuit insensitive to changes in process, voltage or temperature, an accurate LC reference clock is generated.

Figure 2:
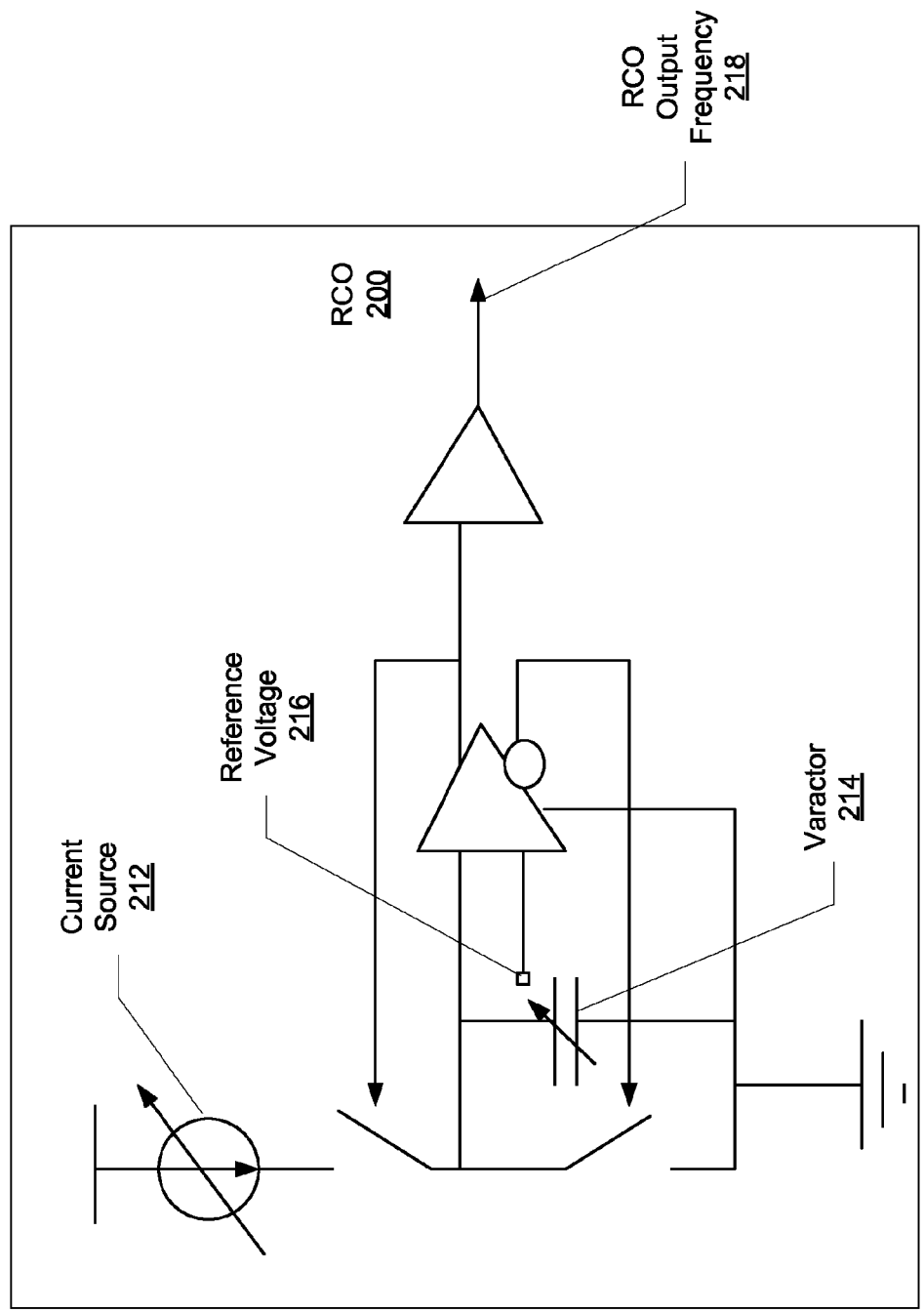
FIG. 2 illustrates an RC oscillator used to generate a low power reference clock in accordance with one example embodiment.

In one embodiment, the LC reference clock frequency is then lowered to a divided reference frequency by the frequency divider 104. Any conventional analog and digital frequency dividers may be used to accomplish the frequency division. Frequency division can be used when the LC reference clock reference frequency does not match the target reference clock frequency. In one embodiment, the LC directly produces the target frequency without the intermediate step of the frequency divider 104. The clock frequency comparator compares the frequency of the divided LC reference clock and the RCO clock. Based on the results of the comparator, the RCO clock generator 108 adjusts the frequency of the RCO clock to match the divided LC clock frequency. In one embodiment, a current source is manipulated to adjust the RCO clock frequency to match the divided LC clock frequency. In another embodiment, a voltage controlled capacitor (varactor) is used to adjust the RCO clock frequency to match the divided LC clock frequency. An RCO circuit with adjustable current source and varactor, in accordance with one embodiment, is illustrated in FIG. 2. After the RCO clock frequency has been adjusted to be near the target reference frequency, the LC circuit is no longer powered. Therefore, the accurate frequency of the LC circuit is leveraged to achieve the target frequency as the RCO output, the RCO drawing significantly less power than the LC circuit. When the target frequency has been reached, the adjustable components of the RCO are held steady to maintain the target frequency.

FIG. 2 illustrates an RCO 200 used to generate a low power reference clock in accordance with one example embodiment. The RCO 200 includes a current source 212, varactor 214, varactor reference voltage 216 and RCO output frequency 218. While exemplary components and configurations are illustrated in FIG. 2, other suitable alternatives and replacements may be used as long as the RCO output frequency 218 is adjustable. For example, a selectable bank of capacitors may be used in place of the varactor 214 as long as the capacitance of the RCO 200 is adjustable. In one embodiment, a voltage supplied to current source 212 controls the current supplied by the current source. The current supplied by the current in turn controls the RCO output frequency 218. Similarly, in one embodiment, the capacitance of the varactor 214 is controlled through adjusting reference voltage 216 and the capacitance of the varactor 214 affects the RCO output frequency 218.

Clock frequency comparator 106 compares the RCO output frequency 218 and divided LC frequency to determine in which direction the RCO output frequency 218 should be adjusted. It is determined whether the RCO output frequency is outside of a threshold value. For example, in one embodiment, threshold values place an upper bound and lower bound on how close the RCO output frequency must be to the target frequency to avoid adjustment. Subsequently, if the RCO frequency falls outside of the threshold values, the current source and/or varactor are adjusted to move the RCO output frequency closer to the target RCO output frequency 218. This process is recursive and performed repeatedly until the RCO output frequency 218 is sufficiently close the target reference frequency. For example, the process may be performed a certain number of times or until the difference between the RCO output frequency 218 and the target reference frequency is below a certain threshold.

Figure 3:
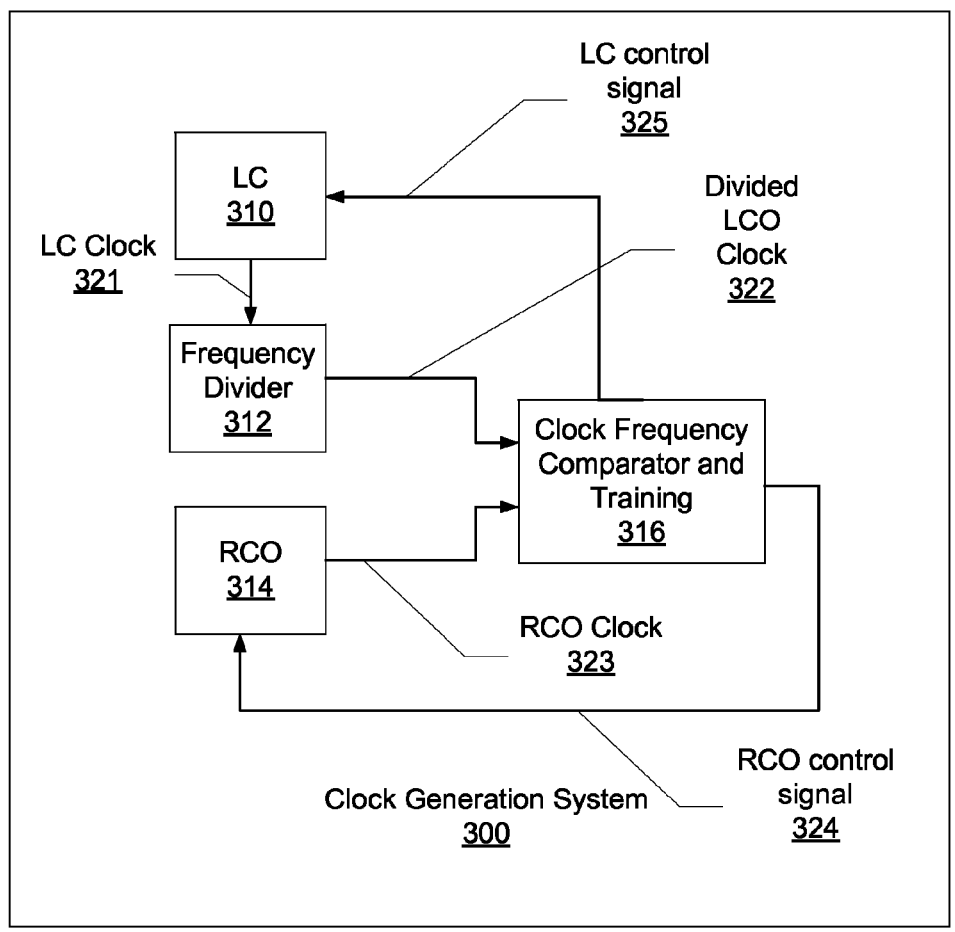
FIG. 3 illustrates an on die clock generation system in accordance with one example embodiment.

FIG. 3 illustrates an on die clock generation system 300 in accordance with one example embodiment. The on die clock generation system 300 includes an LC module 310, a frequency divider module 312, an RCO module 314, and a clock frequency comparator and training module 316. LC module 310 generates an LC clock 321. The LC clock is insensitive to changes in process, voltage and temperature. Frequency divider module 312 lowers the LC clock frequency to match a target frequency as specified for an integrated circuit and outputs a divided LCO clock 322.

The RCO module 314 produces an RCO clock 323 at an unknown initial frequency due to variations in fabrication. The clock frequency comparator and training module 316 compares the divided LC clock and the RCO clock to determine in which direction the frequency of the RCO clock needs to be adjusted. The clock frequency comparator and training module 316 then sends an RCO control signal 324 to the RCO module 314 to adjust the current source or capacitance of the RCO so that the RCO clock frequency is closer to the target frequency. This process is repeated until the RCO clock frequency is within a certain threshold of the target frequency. At that point, the clock frequency comparator and training module 316 sends an LC control signal 325 to turn off the LC circuit, which consumes significantly more power than the RCO circuit. The RCO generated clock can be relied on as accurate since it has been adjusted to be near the target frequency and is insensitive to changes in voltage or temperature. In one embodiment, the LC Clock can be powered on and used as a loop back clock for a built-in self test process during testing or debug mode. For example, to verify that the RCO clock does not vary after the comparator ceases to adjust the RCO clock based on the divided LC clock.

Figure 4:
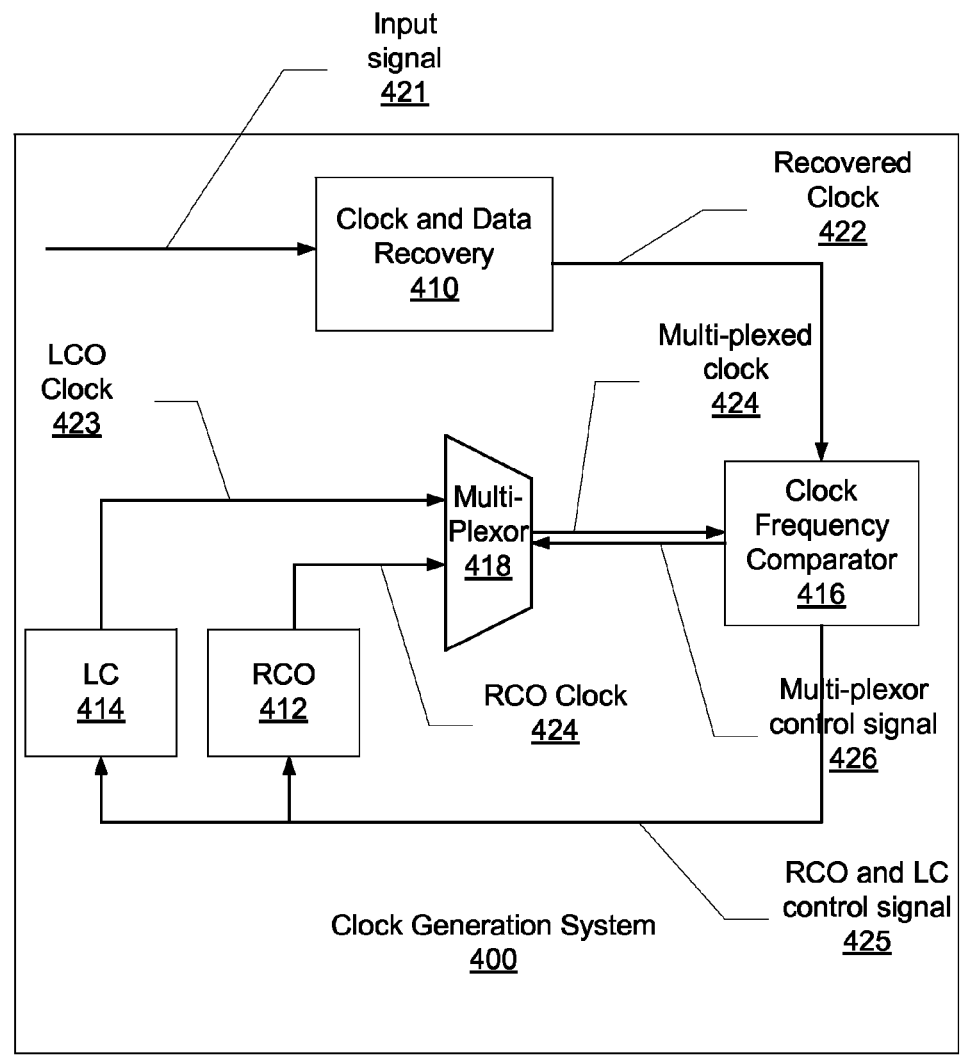
FIG. 4 illustrates an on die clock generation system featuring clock recovery in accordance with one example embodiment.

FIG. 4 illustrates an on die clock generation system 400 featuring clock recovery in accordance with one example embodiment. The on die clock generation system 400 includes a clock and data recovery module 410, an RCO module 412, an LC module 414, a clock frequency comparator 416, and a multiplexor 418. Certain modern data communication protocols, such as DISPLAYPORT, have a known frequency and embed clock timing information into transmitted data. This embedded clock timing information can be analyzed and used as a reference during clock training. Input signal 421 is received by the clock and data recovery module 410. Clock and data recovery module 410 then recovers the embedded clock frequency and outputs a recovered clock 422, with the embedded clock frequency, to the clock frequency comparator module 416.

RCO module 412 and LC module 414 each generate their own reference clocks. Both the RCO and LC circuit feature adjustable components which allow their output frequencies to be manipulated. In one embodiment, the capacitance of each circuit is adjustable similar to the system described in FIG. 3. Clock frequency comparator module 416 controls a multi-plexor 418 via multi-plexor control signal 426 to select which clock, RCO or LC, will be trained. Clock frequency comparator module 416 then compares the recovered clock 422 and the multi-plexed clock 424. Based on the comparison a RCO and LC control signal 425 is sent to the RCO module 412 and LC module 414. The control signal causes the capacitance of the RCO or LC circuits to be adjusted and the corresponding output clock frequency to become closer to the frequency of the recovered clock 422. Eventually, the RCO clock 424 or LC clock 423 frequency will come within a certain threshold of the recovered clock 422 frequency and the clock and data recover module 410 and clock frequency comparator module 416 can be disabled. Similarly, the clock that has not been adjusted to match the recovered clock frequency can also be disabled to save power.

Figure 5:
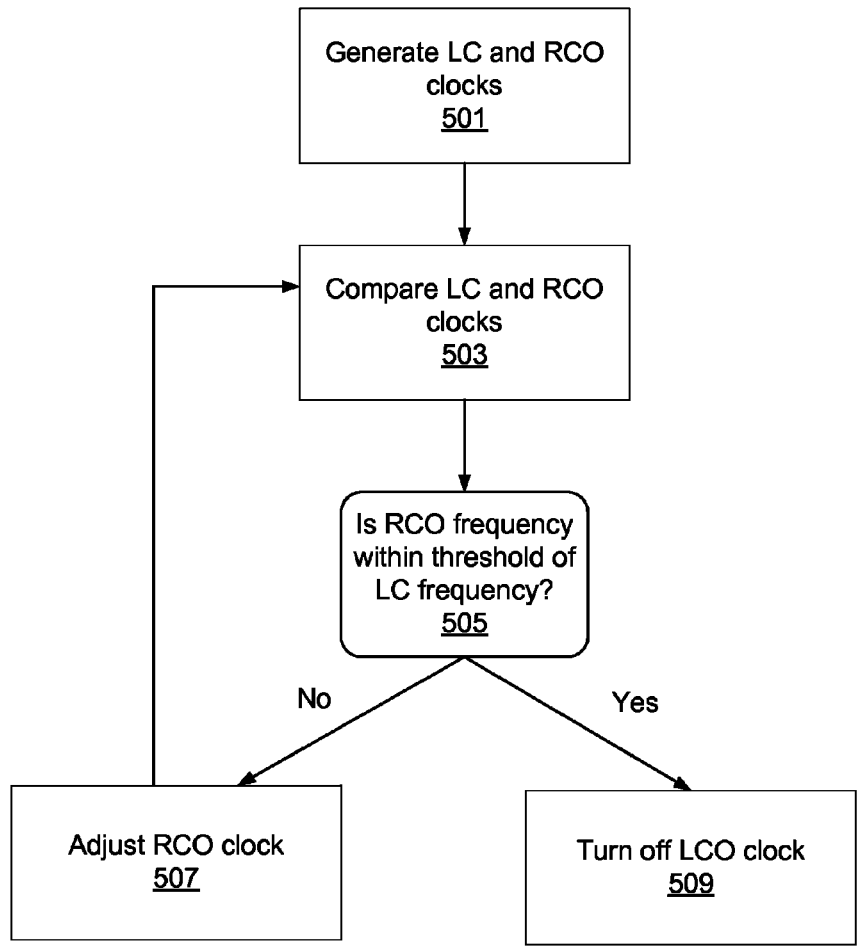
FIG. 5 is a flow chart illustrating a method for generating a lower power high accuracy clock according to one example embodiment.

FIG. 5 is a flow chart illustrating a method for generating a lower power high accuracy clock according to one embodiment. LC and RCO clocks are generated 501. The LC clock has a known frequency and is insensitive to changes in process, voltage and temperature. In one embodiment, the LC clock frequency is lowered by voltage divider to a target reference frequency before being transmitted to a comparator. The RCO clock is initially at an unknown frequency due to possible variations in manufacturing. The LC and RCO clock frequencies are compared 503 to determine whether 505 the RCO clock frequency is within a given threshold of the LC clock or target reference clock frequency. If not, the RCO circuit is adjusted 507 in an attempt to make the RCO clock frequency better match the LC clock frequency. The process is then repeated until the RCO clock frequency is brought within a threshold of the LC clock frequency. When this occurs, the RCO clock is known to be accurate and the LC clock is disabled. Disabling the LC clock saves power that would have been expended powering the LC circuit.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms, for example, as described in FIG. 2. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The phrase "in one embodiment" in various places in the specification is not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and method for generating a low power high accuracy on die reference clock through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A method for generating a reference clock for an integrated circuit, the method comprising:
   receiving a first clock and a second clock, generation of the first clock consuming more power than generation of the second clock;
   determining a frequency of the first clock and a frequency of the second clock;
   comparing the frequency of the first clock and a frequency of the second clock;
   determining whether the frequency of the second clock is outside of a low threshold value or a high threshold value when compared to the frequency of the first clock;
   transmitting, in response to determining the frequency of the second clock is lower than the low threshold value, a low clock adjustment signal causing the frequency of the second clock to be increased; and transmitting, in response to determining the frequency of the second clock is higher than the high threshold value, a high clock adjustment signal causing the frequency of the second clock to be reduced.

2. The method of claim 1, further comprising:
determining that the frequency of the second clock is higher than the low threshold value and lower than the high threshold value, the low threshold value and high threshold value based on the first clock; and
transmitting a clock disable signal, the clock disable signal causing the first clock to cease being generated and reduce power consumption.

3. The method of claim 2, wherein the first clock is generated by an LC circuit.

4. The method of claim 3, wherein the second clock is generated by an RC oscillator.

5. The method of claim 4, wherein the LC circuit and the RC oscillator are located on the integrated circuit.

6. The method of claim 1, further comprising:
receiving an input signal;
recovering a clock frequency embedded in the input signal; and
generating the first clock, the first clock having the embedded clock frequency.

7. The method of claim 1, further comprising:
determining that the frequency of the second clock is within the threshold value of the frequency of the first clock; and
performing debugging by comparing the frequency of the first clock with the frequency of the second clock and ceasing to adjust the frequency of the second clock.

8. A system for generating a reference clock for an integrated circuit, the system comprising:
a first clock module configured to generate a first clock;
a second clock module configured to generate a second clock, generation of the first clock consuming more power than generation of the second clock; and
a clock frequency comparator module coupled to the first clock module and the second clock module, the clock frequency comparator module determining a frequency of the first clock and a frequency of the second clock, comparing the two frequencies, responsive to determining that the frequency of the second clock is lower than a low threshold value, transmitting a low clock adjustment signal to the second clock module, the low clock adjustment signal causing the frequency of the second clock to be increased and, responsive to determining that the frequency of the second clock is higher than a high threshold value, transmitting a high clock adjustment signal to the second clock module, the high clock adjustment signal causing the frequency of the second clock to be reduced.

9. The system of claim 8, wherein the clock frequency comparator module, responsive to determining that the frequency of the second clock is higher than the low threshold value and lower than the high threshold value, transmits a clock disable signal to the first clock module causing the first clock module to cease generating the first clock and reduce power consumption.

10. The system of claim 9, wherein the first clock is generated by an LC circuit.

11. The system of claim 10, wherein the second clock is generated by an RC oscillator.

12. The system of claim 11, wherein the LC circuit and the RC oscillator are located on the integrated circuit.

13. The system of claim 8, further comprising:
a clock and data recovery module configured to receive an input signal and recover a clock frequency embedded in the input signal, the frequency of the first clock based on the embedded clock frequency.

14. The system of claim 8, wherein the clock frequency comparator module, responsive to determining that the frequency of the second clock is within the threshold value of the frequency of the first clock, performs debugging by comparing the frequency of the first clock with the frequency of the second clock and ceasing to adjust the frequency of the second clock.

15. A computer program product for generating a reference clock for an integrated circuit, the computer program product comprising a non-transitory computer-readable storage medium storing instructions that when executed cause at least one processor to perform steps comprising:
receiving a first clock and a second clock, generation of the first clock consuming more power than generation of the second clock;
determining a frequency of the first clock and a frequency of the second clock;
comparing the frequency of the first clock and a frequency of the second clock;
determining that the frequency of the second clock is outside of a low threshold value or a high threshold value when compare to the frequency of the first clock;
transmitting, responsive to determining the frequency of the second clock is lower than the low threshold value, a low clock adjustment signal causing the frequency of the second clock to be adjusted; and
transmitting, responsive to determining the frequency of the second clock is higher than the high threshold value, a high clock adjustment signal causing the frequency of the second clock to be reduced.

16. The computer program product of claim 15, the steps further comprising:
determining that the frequency of the second clock is higher than the low threshold value and lower than the high threshold value; and
transmitting a clock disable signal, the clock disable signal causing the first clock to cease being generated and reduce power consumption.

17. The computer program product of claim 16, wherein the first clock is generated by an LC circuit.

18. The computer program product of claim 17, wherein the second clock is generated by an RC oscillator.

19. The computer program product of claim 18, wherein the LC circuit and the RC oscillator are located on the integrated circuit.

20. The computer program product of claim 15, the steps further comprising:
receiving an input signal;
recovering a clock frequency embedded in the input signal; and
generating the first clock, the first clock having the embedded clock frequency.

21. The computer program product of claim 15, the steps further comprising:
determining that the frequency of the second clock is within the threshold value of the frequency of the first clock; and
performing debugging by comparing the frequency of the first clock with the frequency of the second clock and ceasing to adjust the frequency of the second clock.

* * * * *